United States Patent [19]

El-Sharawy et al.

[11] Patent Number: 5,912,481

[45] Date of Patent: Jun. 15, 1999

[54] HETEROJUNCTION BIPOLAR TRANSISTOR HAVING WIDE BANDGAP, LOW INTERDIFFUSION BASE-EMITTER JUNCTION

[75] Inventors: El-Badawy Amien El-Sharawy, Gilbert, Ariz.; Majid M. Hashemi, Sunnyvale, Calif.

[73] Assignee: National Scientific Corp., Phoenix, Ariz.

[21] Appl. No.: 08/939,487

[22] Filed: Sep. 29, 1997

[51] Int. Cl.[6] .......................... H01L 29/70; H01L 29/732
[52] U.S. Cl. .............................. 257/198; 257/200
[58] Field of Search ................... 257/190, 197, 257/198, 200, 312, 199

[56] References Cited

U.S. PATENT DOCUMENTS

| | | | |
|---|---|---|---|
| 3,984,857 | 10/1976 | Mason | 357/16 |
| 4,120,706 | 10/1978 | Mason | 148/175 |
| 4,180,825 | 12/1979 | Mason | 357/16 |
| 4,233,613 | 11/1980 | Morimoto | 357/16 |
| 4,588,451 | 5/1986 | Vernon | 148/175 |
| 4,706,100 | 11/1987 | Tufte | 357/16 |
| 4,928,154 | 5/1990 | Umeno et al. | 357/16 |
| 4,959,702 | 9/1990 | Moyer et al. | 357/34 |
| 4,983,534 | 1/1991 | Kikuta | 437/31 |
| 5,016,065 | 5/1991 | Seki et al. | 357/16 |
| 5,053,835 | 10/1991 | Horikawa et al. | 357/16 |
| 5,081,519 | 1/1992 | Nishimura | 357/60 |
| 5,091,333 | 2/1992 | Fan et al. | 437/82 |
| 5,134,446 | 7/1992 | Inoue | 257/190 |
| 5,144,379 | 9/1992 | Eshita et al. | 257/190 |
| 5,198,689 | 3/1993 | Fujioka | 257/197 |
| 5,281,834 | 1/1994 | Cambou et al. | 257/200 |
| 5,422,502 | 6/1995 | Kovacic | 257/197 |
| 5,426,316 | 6/1995 | Mohammad | 257/197 |
| 5,473,174 | 12/1995 | Ohsawa | 257/190 |
| 5,523,243 | 6/1996 | Mohammad | 438/312 |
| 5,708,281 | 1/1998 | Morishita | 257/198 |
| 5,734,183 | 3/1998 | Morishita | 257/197 |
| 5,789,800 | 8/1998 | Kohno | 257/197 |

OTHER PUBLICATIONS

IBM Technical Disclosure Bulletin, vol. 32, pp. 120–121, "Doping of III–V Compounds by Channeled Implants and Its Applications", Aug. 1995.

C.C. Hu, et al., The Fabrication of InGaP/Si Light Emitting Diode by Metal–Organic Chemical Vapor Deposition, 1997 Materials Chemistry & Physics, 48 pp. 17–20.

Susumo Kondo, et al., InGaP Orange Light–Emitting Diodes on Si Substrates, Nov. 6, 1989, Appl. Phys. Lett. 55(19), pp. 1981–1983.

S.F. Fang, et al., Gallium Arsenide and Other Compound Semiconductors on Silicon, J. Appl. Phys. 68(7), Oct. 1, 1990, pp. R31–R58.

T. Soga, et al., Electrical Properties of GaP on Si Grown by Metalorganic Chemical Vapor Deposition, Journal of Crystal Growth, 132(1993) pp. 414–418.

Sugiura et al., In Situ Observation of the Strain in GaP on Si During Cooling Step After Growth by Raman Spectroscopy, J. Appl. Phys. 77(8) Apr. 15, 1995, pp. 4009–4012.

Bachmaun, et al., Heteroepitaxy of Lattice–Matched Compound Semiconductors on Silicon, J. Vac. Sci. Technol. A 13(3), May/Jun. 1995, pp. 696–704.

Wright, et al., Molecular Beam Epitaxial Growth of GaP on Si, J. Appl. Phys. 55(8) Apr. 15, 1984, pp. 2916–2927.

Olson, et al., MOCVD Growth and Characterization of GaP on Si, Journal of Crystal Growth, 77(1986) 515–523.

*Primary Examiner*—Olik Chaudhuri
*Assistant Examiner*—William David Coleman
*Attorney, Agent, or Firm*—Meschkow & Gresham, P.L.C.; Lowell W. Gresham; Jordon M. Meshkow

[57] ABSTRACT

A heterojunction bipolar transistor (20) is provided with a silicon (Si) base region (34) that forms a semiconductor junction with a multilayer emitter (38) having a thin gallium arsenide (GaAs) emitter layer (36) proximate the base region (34) and a distal gallium phosphide emitter layer (40). The GaAs emitter layer (36) is sufficiently thin, preferably less than 200 Å, so as to be coherently strained.

14 Claims, 4 Drawing Sheets

HETEROJUNCTION BIPOLAR TRANSISTOR HAVING WIDE BANDGAP, LOW INTERDIFFUSION BASE-EMITTER JUNCTION

TECHNICAL FIELD OF THE INVENTION

The present invention relates generally to heterojunction bipolar transistors (HBTs) formed on silicon substrates.

BACKGROUND OF THE INVENTION

Heterojunction bipolar transistors (HBTs) theoretically provide advantages over conventional homojunction bipolar transistors by providing a heterojunction between a base and emitter of a transistor. A heterojunction is formed between two dissimilar semiconductor materials. Silicon (Si) exhibits a bandgap of around 1.12 eV, but a Si homojunction has no bandgap discontinuity at the junction. A bandgap discontinuity can occur at a junction by using dissimilar semiconductor materials on opposing sides of the junction. From the perspective of an NPN transistor, discontinuity in the valence band restricts hole flow from the base to the emitter, thus improving emitter injection efficiency and current gain. To the extent that injection efficiency and current gain improvements can be achieved, base region resistivity may be lowered (which lowers the base resistance) and emitter region resistivity may be raised (which lowers base-emitter junction capacitance) to create fast transistors without significantly compromising other device parameters. Such fast transistors would be useful for high speed digital, microwave and other integrated circuit and discrete transistor applications.

In practice, HBT performance often falls far short of the theoretical expectations. One conventional Si-based HBT reduces the bandgap of the base region by creating a base material having a narrower bandgap than Si. In particular, a small amount of germanium (Ge) is mixed with Si in the base ($Si_{1-x}Ge_x$), and the emitter is more purely Si. Unfortunately, the amount of bandgap difference ($\Delta Eg$) for as much as 20% Ge content in the base is only about 0.15 eV. This small $\Delta Eg$ achieves only a small portion of the performance benefits that HBTs theoretically promise.

Slight improvements in HBT performance have been achieved by using materials other than Si for the emitter of an HBT. Three emitter materials which have been investigated for use in HBT transistors are silicon carbide (SiC), which has a bandgap of 2.93 eV, gallium arsenide (GaAs) which has a bandgap of 1.42 eV, and gallium phosphide (GaP), which has a bandgap of 2.24 eV. Unfortunately, such materials have lattice constants which differ from Si. For example, SiC has a 20% lattice mismatch, GaAs has a 4% lattice mismatch, and GaP has a 0.34% lattice mismatch. Likewise, such materials have thermal expansion coefficients which differ from Si. Si has a thermal expansion coefficient of around $2.6 \times 10^{-6}$ (° C.)$^{-1}$, while GaAs has a thermal expansion coefficient of around $6.7 \times 10^{-6}$ (° C.)$^{-1}$, and GaP has a thermal expansion coefficient of around $5.91 \times 10^{-6}$ (° C.)$^{-1}$. Because of these differences, only thin layers of these materials have been successfully grown on Si without the formation of significant defects. The maximum thickness for a low defect layer of SiC grown on Si is only a few angstroms (Å) and for GaAs grown on Si is less than 200 Å. At these thicknesses or less, strain which is caused by lattice mismatch is contained by lattice stretching rather than crystal defects. Thinner, low-defect thicknesses of these materials do not possess a sufficient thickness to protect the base-emitter junction from shorting due to diffusion of metal from the emitter contact region. Thicker, high-defect thicknesses of these materials exhibit degraded junction performance due to an excessive number of defects.

The most successful HBT improvements to date are believed to have been achieved by forming a GaP layer over Si at the base-emitter junction. GaP is desirable because it has a relative large bandgap (i.e. about 2.24 eV) and little lattice mismatch with silicon (i.e. about 0.34%). Nevertheless, such conventional HBTs that use a GaP layer over Si still achieve only a small portion of the performance benefits that HBTs theoretically promise. The reason for this poor performance appears to be that a Si—GaP junction suffers from an unusually large amount of interdiffusion, where the Ga and P readily diffuse into the Si, and vice-versa. The interdiffusion between Si and GaP results in a poor semiconductor junction, with the metallurgical junction being displaced from the electrical junction. Accordingly, the performance gains that are suggested by the wide bandgap difference between a Si base and a GaP emitter are not achieved in practice because the resulting diffuse junction negates those potential gains.

In the field of photoelectric semiconductors, it is desirable to form compound structures using a Si substrate and direct gap semiconductor materials. A Si substrate is desirable for mechanical stability and because a manufacturing infrastructure exists for reliably mass producing rugged Si wafers at relatively low cost. The Si substrate is typically an extrinsic part of the photoelectric semiconductor not used in forming intrinsic photoelectric semiconductor junctions.

Compound structures using a Si substrate and direct gap semiconductor materials suffer from problems similar to those discussed above for HBTs. Namely, lattice constant and thermal expansion coefficients for direct gap semiconductors differ from Si. Consequently, in attempting to produce low-defect compound semiconductors having direct gap semiconductors and a Si substrate, conventional photoelectric semiconductors often include very thick, highly doped buffer layers between the Si substrate and direct gap materials. Such buffer layers may include indirect gap materials, such as GaP and others, but these indirect gap materials are unsuitable for intrinsic photoelectric semiconductors.

Such buffer layers tend to incrementally shift lattice constants and thermal expansion coefficients so that the intrinsic direct gap photoelectric semiconductor materials may then be grown with fewer defects. Such applications often form relatively thick buffer layers which themselves may have numerous defects, at least closer to a Si interface, that are of little consequence to the intrinsic photoelectric semiconductor. Needless to say, such buffer layers are not used in forming semiconductor junctions.

SUMMARY OF THE INVENTION

Accordingly, it is an advantage of the present invention that an improved heterojunction bipolar transistor (HBT) having wide a bandgap with low interdiffusion base-emitter junction and method therefor are provided.

Another advantage of the present invention is that a HBT is provided which uses a Si substrate.

Another advantage is that an HBT having a multilayer emitter is provided.

Another advantage is that an HBT is provided which has a wide bandgap emitter along with a base-emitter junction that is substantially free of interdiffusion.

Another advantage is that an HBT is provided with a Si base region that forms a junction with a multilayer emitter having a thin GaAs layer proximate the base region and a distal GaP layer.

Another advantage is that an HBT is provided that exhibits performance which more closely meets theoretical expectations than conventional HBTs.

The above and other advantages of the present invention are carried out in one form by a heterojunction bipolar transistor which includes a Si collector region of a first conductivity type. A Si base region of a second conductivity type resides adjacent to the collector region. A GaAs layer resides over and in contact with the Si base region. The GaAs layer forms a first portion of a multilayer emitter. A GaP layer of the first conductivity type resides over the GaAs layer and forms a second portion of the multilayer emitter.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

FIGS. 1–10 show sectional views of a heterojunction bipolar transistor (HBT) 20 configured in accordance with the present invention at first through tenth processing stages, respectively. The Figures illustrate an NPN implementation of the present invention, but those skilled in the art will realize that an equivalent PNP implementation is easily achieved by making routine substitutions well known to those skilled in the art.

Figure 1:
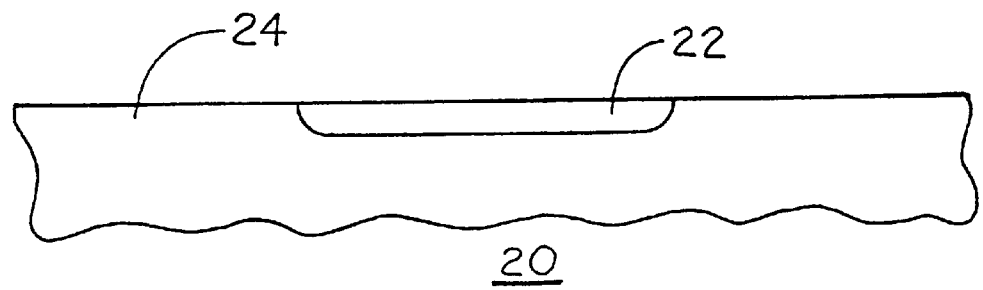
FIGS. 1–10 shows sectional views of an HBT at first through tenth processing stages, respectively.

FIG. 1 illustrates a first processing stage in which a buried region 22 is formed in a silicon (Si) substrate 24. Preferably, substrate 24 is lightly doped P-type conductivity, and buried region 22 is heavily doped through a standard ion implantation process to exhibit N-type conductivity for this NPN implementation.

Figure 2:
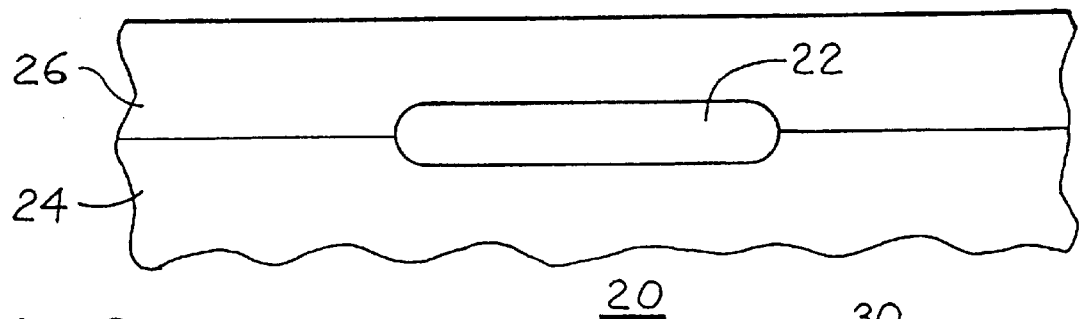

FIG. 2 illustrates a second processing stage that follows the first processing stage depicted in FIG. 1. As illustrated in FIG. 2, a collector layer 26 is epitaxially grown on substrate 24. Buried region 22 is now diffused into both collector layer 26 and substrate 24. Collector layer 26 is a lightly doped N-type conductivity. Phosphorous, antimony or arsenic N-type dopants are used through conventional techniques, such as ion implantation or diffusion, to achieve the desired conductivity type. Buried region 22 allows collector layer 26 to exhibit a low resistance while controlling the breakdown voltage of HBT 20. As understood by those skilled in the art, the thickness of collector layer 26 is selected to achieve application-specific goals. For example, collector layer 26 is desirably thinner to increase the speed of HBT 20 and thicker to increase the breakdown voltage of HBT 20.

Figure 3:
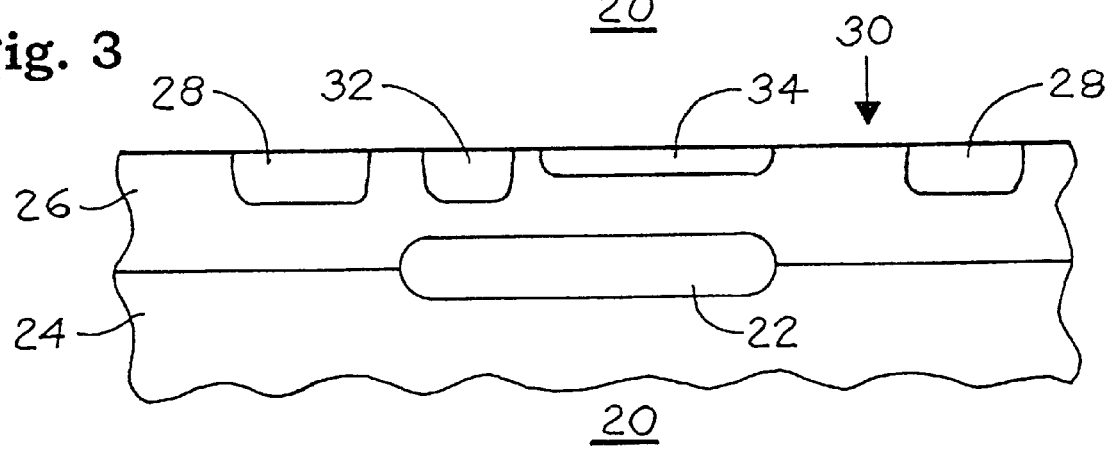

FIG. 3 illustrates a third processing stage that follows the second processing stage depicted in FIG. 2. FIG. 3 shows several independent diffusion areas formed in collector layer 26. A highly doped P-type conductivity isolation diffusion area 28 is made to surround a collector region 30, which provides proper isolation for the final HBT 20. Collector region 30 will eventually serve as the collector of HBT 20. Area 28 desirably refrains from overlying any portion of buried region 22.

A highly doped N-type conductivity contact-enabling diffusion area 32 is made at a location within collector region 30 where a metallized layer will eventually make an electrical collector contact. This location desirably overlies a portion of buried layer 22.

A base region 34 is another diffusion area that is also formed within collector region 30. Base region 34 will eventually serve as the base of HBT 20. Base region 34 is doped to exhibit P-type conductivity for this NPN implementation. Desirably, base region 34 is heavily doped so that the base of HBT 20 will exhibit an unusually low resistance. Diffusion areas 28, 32 and 34 are formed using conventional ion implantation or other techniques. Isolation and contact enabling areas 28 and 32 are desirably formed using a much higher acceleration voltage than base region 34 to drive areas 28 and 32 deeper into collector layer 26 than base region 34.

In an alternate embodiment, a small amount of germanium (Ge) is mixed with the Si of base region 34 to lower the bandgap of the base of HBT 20 when compared to the bandgap of a base formed using more pure Si. This mixing is desirably performed during the second stage depicted in FIG. 2. Small amounts of Ge (e.g. around 10%) with a P+ type doping can be mixed with the Si during only the later portion of epitaxial growth for collector layer 26 to form the base.

Figure 4:
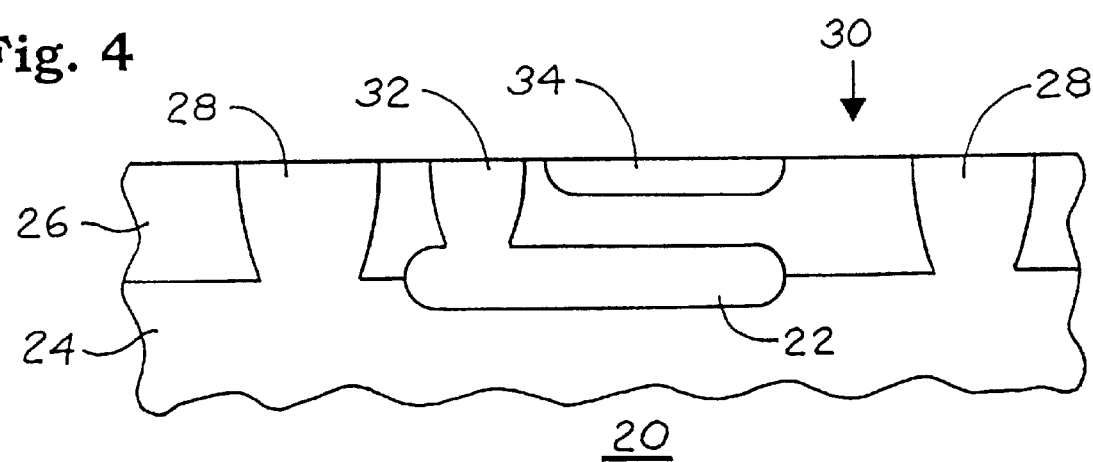

FIG. 4 illustrates a fourth processing stage that follows the third processing stage depicted in FIG. 3. FIG. 4 illustrates heat being applied to further drive diffusion areas 28, 32 and 34 deeper into collector layer 26. Isolation diffusion area 28 is desirably driven through collector layer 26 to substrate 24. Contact enabling area 32 is desirably driven through collector region 30 to buried region 22. However, base region 34 is desirably driven only a shallow depth into collector layer 26. Desirably, base region 34 is around 1000 Å deep. However, the resulting base of HBT 20 will be more shallow than this depth due to subsequent etching steps. This shallow depth of base region 34 leads to a low transit time, which increases the high current gain cut-off frequency ($F_t$) and high power gain cut-off frequency ($F_{max}$) parameters for HBT 20.

During this fourth stage of processing, heat in excess of 800° C. may be applied to HBT 20 for extended periods of time. However, after this stage the temperature of HBT 20 is desirably maintained below 800° C. to prevent diffusion of non-silicon layers that will be grown over collector layer 26.

Figure 5:
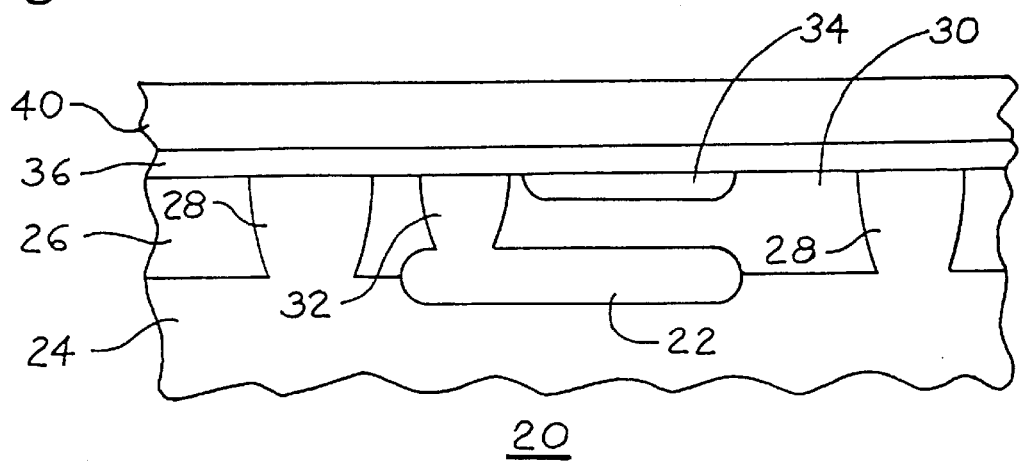

FIG. 5 illustrates a fifth processing stage that follows the fourth processing stage depicted in FIG. 4. FIG. 5 actually illustrates two epitaxial growth processes. The first epitaxial growth process grows a wide bandgap, non-silicon semiconductor, preferably gallium arsenide (GaAs), over and in contact with collector layer 26 to form a first emitter layer 36 of a multilayer emitter 38 (see FIG. 6). First layer 36 may be of N-type conductivity for this NPN implementation or may not be intentionally doped, but is desirably configured so as not to exhibit P-type conductivity. A function of first emitter layer 36 is a diffusion barrier to provide a stable interface with the Si of base region 34.

The second epitaxial growth process grows a second non-silicon, wide bandgap semiconductor, preferably gallium phosphide (GaP), over and in contact with first layer 36 to form a second emitter layer 40 of multilayer emitter 38.

Desirably, second layer 40 is degeneratively doped with a suitable N-type conductivity material for this NPN implementation, such as Si, to values in excess of $10 \times 10^{20}$/cm$^3$ to provide a very low emitter contact resistance where a metallized layer will eventually make an electrical emitter contact. Desirably, doping gradually increases as second layer 40 builds away from first layer 36 to reach the maximum value at the distal surface from first layer 36. The function of second emitter layer 40 is to provide maximum valence band discontinuity with minimum lattice mismatch and minimal thermal expansion mismatch with respect to Si.

GaAs is a desirable material for use as an interface with Si because it can form an interface substantially free from interdiffusion, particularly when compared to the interdiffusion that results from forming a GaP layer on Si. In other words, an atomically abrupt interface forms between GaAs layer 36 and base region 34. Desirably, first layer 36 is epitaxially grown using conventional techniques but at a relatively low temperature (e.g. 400–600° C.) to keep the Si-GaAs junction as free from interdiffusion as possible. Alternate cycles of even lower temperatures (e.g. 150–250° C.) may be applied during the growth process. This results in a substantially pure crystalline structure suitable for intrinsic semiconductor activity.

Moreover, first layer 36 is limited in thickness so that first layer 36 will be coherently strained between the Si of base region 34 and second layer 40. Thickness is limited in a manner understood to those skilled in the art by controlling the time over which first layer 36 is grown. A coherently strained layer is a layer so thin that lattice constant mismatches do not result in lattice mismatch crystal defects but are contained by lattice stretching. With first layer 36 made from GaAs and second layer 40 made from GaP, a thickness for layer 36 of less than 200 Å is preferred, with a thickness of less than 50 Å being particularly desirable.

The thickness of second emitter layer 40 is desirably much greater than the thickness of first emitter layer 36. Layer 40 is desirably at least 500 Å thick, and preferably around 2000–3000 Å thick. Less overall thickness is desired for emitter 38. Less thickness leads to a smaller emitter resistance and a faster HBT 20. However, the thickness of emitter 38, and primarily second emitter layer 40, is balanced with a need to prevent the emitter and base of HBT 20 from shorting. Shorting can occur when metallization, discussed below, diffuses through emitter 38 to reach base region 34. A sufficient thickness for second layer 40 prevents metallization from diffusing therethrough.

Second layer 40 is desirably grown epitaxially using standard techniques at temperatures that generally remain in the 400–600° C. range to preserve the substantially interdiffusion-free interface between first emitter layer 36 and base region 34. Although not shown, toward the upper regions of second layer 40, distally removed from first emitter layer 36, temperature may be lowered so that this portion of second emitter layer 40 becomes polycrystalline. Among other benefits, this lessens the time HBT 20 spends at elevated temperatures to further lessen risks of interdiffusion at the base-emitter junction.

While first emitter layer 36 provides an abrupt interface with Si base region 34, second layer 40 provides as great of a bandgap discontinuity as is practical. Thus, the bandgap characteristics of HBT 20 in the vicinity of the base-emitter junction are determined primarily by the bandgap differences between materials used for base region 34 and second layer 40. However, the abruptness of the base-emitter junction (i.e. the congruence of the metallurgical and electrical junctions) is determined primarily by materials used for base region 34 and first layer 36.

Due to the thin, coherently strained nature of first emitter layer 36, base region 34 exhibits few defects. Likewise, second emitter layer 40, although relatively thick, exhibits few defects in part because first emitter layer 36 is sufficiently thin to be coherently strained. Accordingly, not only does first layer 36 provide a clean, abrupt semiconductor junction at base region 34, but first layer 36 allows second layer 40 to be epitaxially grown to a relatively thick width with few defects.

Figure 6:
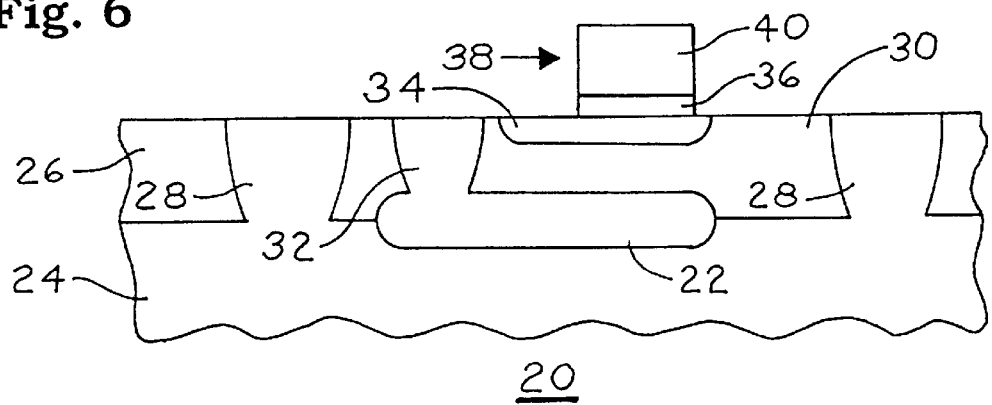

FIG. 6 illustrates a sixth processing stage that follows the fifth processing stage depicted in FIG. 5. FIG. 6 shows a patterning and etching process. Conventional photolithographic techniques can be used to pattern HBT 20, then etching is performed to remove portions of first and second emitter layers 36 and 40 that will not be used for emitter 38.

Figure 7:
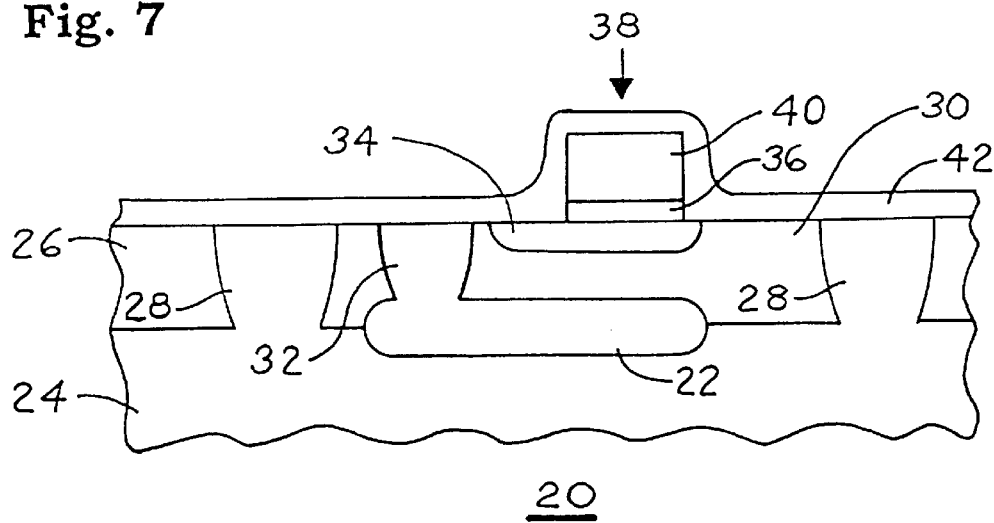

FIG. 7 illustrates a seventh processing stage that follows the sixth processing stage depicted in FIG. 6. FIG. 7 shows a passivation process. Conventional techniques are used to apply a passivation layer 42 over the entire surface of HBT 20 at this point. Silicon nitride, silicon dioxide, or other conventional passivation materials may be applied in a conventional manner, so long as temperatures generally remain below about 800° C.

Figure 8:
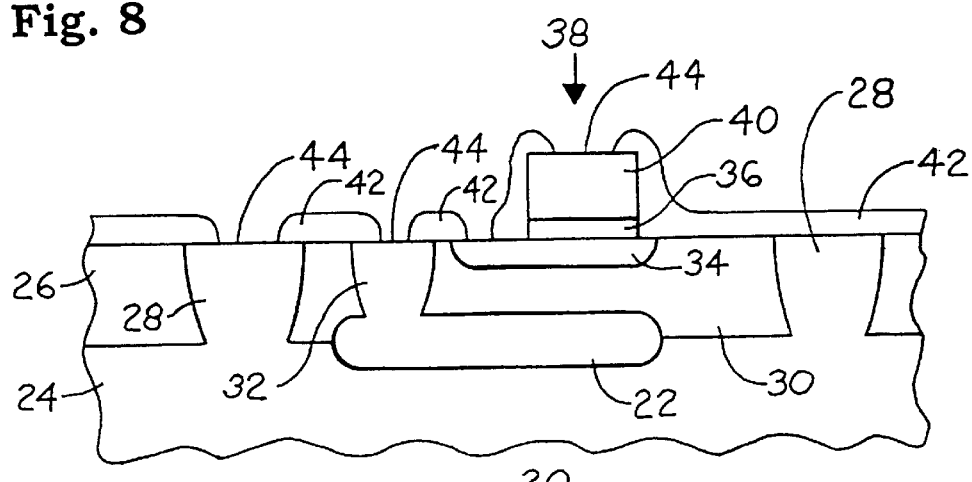

FIG. 8 illustrates an eighth processing stage that follows the seventh processing stage depicted in FIG. 7. FIG. 8 shows another patterning and etching process. Conventional photolithographic techniques can be used to pattern HBT 20, then etching is performed to remove passivation layer 42 to form vias 44 in locations where a metallized layer will eventually make electrical contacts.

Figure 9:
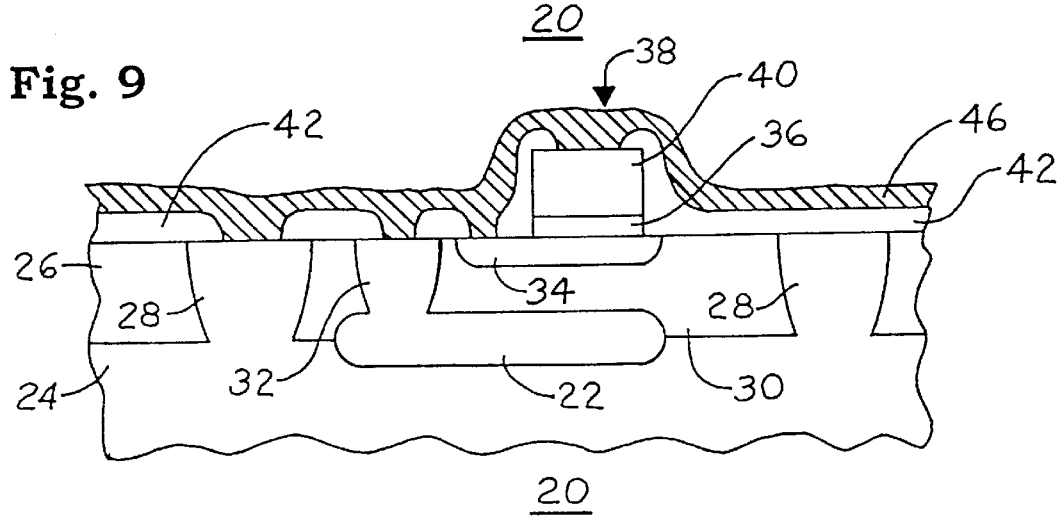

FIG. 9 illustrates a ninth processing stage that follows the eighth processing stage depicted in FIG. 8. FIG. 9 shows a metallization process which uses conventional techniques to deposit a metallized layer 46 over the entire surface of HBT 20.

Figure 10:
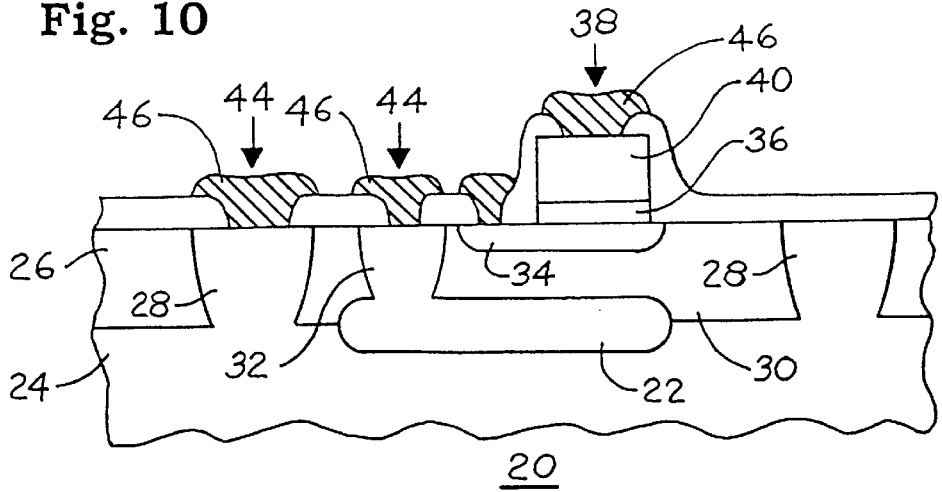

FIG. 10 illustrates a tenth processing stage that follows the ninth processing stage depicted in FIG. 9. FIG. 10 shows yet another patterning and etching process. Conventional photolithographic techniques can be used to pattern HBT 20, then etching is performed to remove metallization layer 46 where not wanted over the surface of HBT 20. However, metallization layer 46 remains within and over vias 44 to form electrical contacts with the base, collector, and emitter regions of HBT 20.

Figure 11:
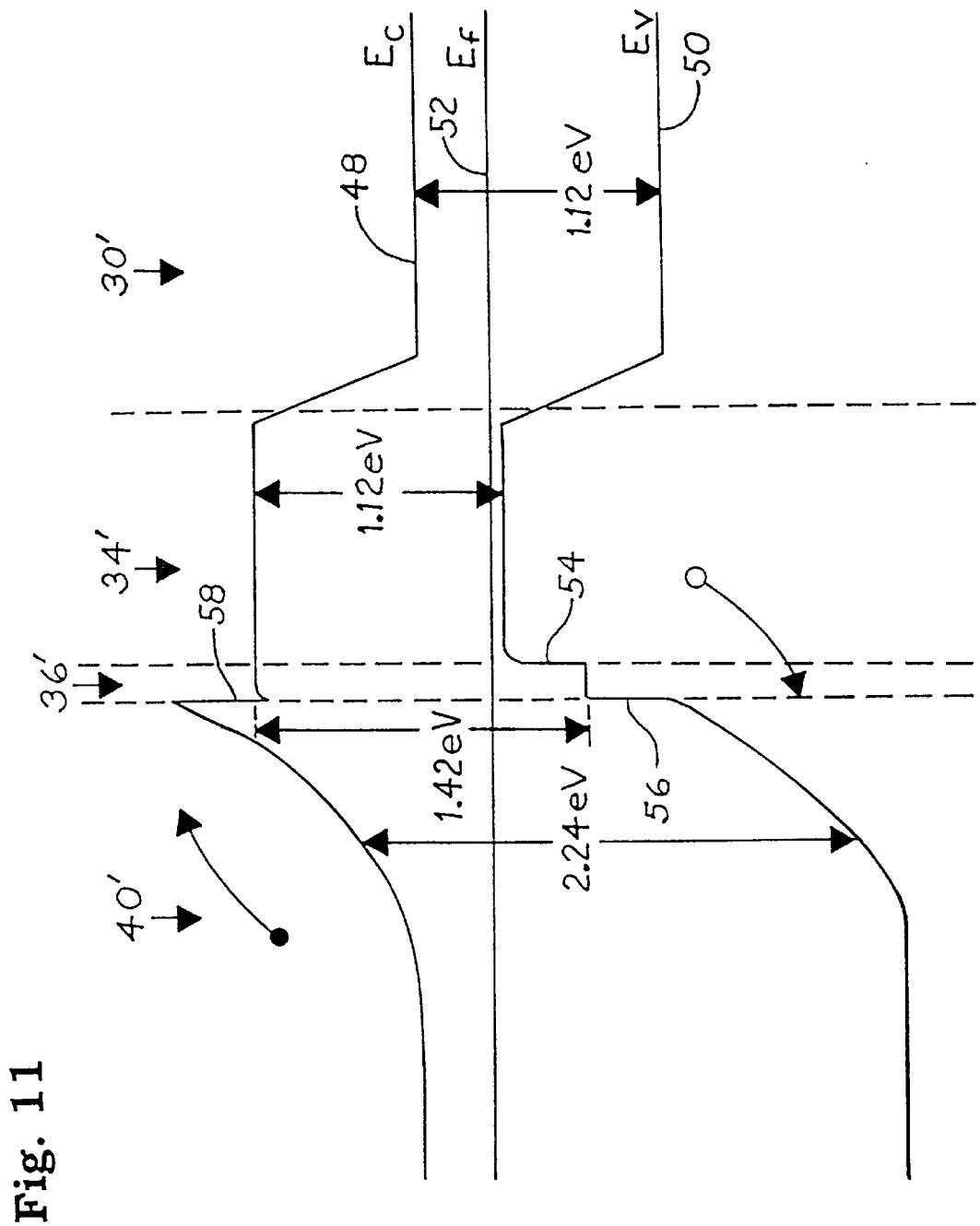
FIG. 11 shows a schematic, zero biased, band diagram of composite emitter HBT according to a preferred embodiment of the present invention.

FIG. 11 shows a schematic, zero biased, band diagram for HBT 20. FIG. 11 depicts a conduction band ($E_c$) trace 48 and a valence band trace ($E_v$) 50 on vertically opposing sides of a Fermi level ($E_f$) 52. The band diagram of FIG. 11 is horizontally partitioned into four sections 30', 34', 36' and 40' corresponding to collector region 30, base region 34, first emitter layer 36, and second emitter layer 40 (FIG. 10), respectively.

Referring to FIGS. 10–11, in collector region 30 the bandgap energy equals $E_c-E_v$, or approximately 1.12 eV. In base region 34 the bandgap energy still equals approximately 1.12 eV. In other words, base region 34 has roughly the same bandgap as collector region 30.

In first emitter layer 36, the bandgap energy equals approximately 1.42 eV. This increase of roughly 0.3 eV from the bandgap of base region 34 and collector region 30 is due to the higher bandgap of GaAs compared to the bandgap of Si. Moreover, substantially all of this 0.3 eV appears as a discontinuity 54 in the valence band $E_v$. Very little of the increase in bandgap achieved by transitioning from Si to GaAs in first layer 36 appears in conduction band $E_c$.

In second emitter layer 40, the bandgap equals approximately 2.24 eV. This represents an increase of roughly 0.8 eV from the bandgap in first emitter layer 36. Accordingly, another discontinuity in the bandgap energy results. This discontinuity is divided between a valence band discontinuity 56 of approximately 0.5 eV and a conduction band discontinuity 58 of approximately 0.3 eV. The total bandgap discontinuity between second layer 40 and base region 36 is approximately 1.1 eV, with the majority of the discontinuity appearing in the valence band $E_v$. The majority of the discontinuity appearing in the valence band $E_v$ is desirable for NPN transistors because it is the parameter that characterizes the suppression of hole injection.

Not only does first layer 36 provide a stable, abrupt semiconductor junction at base region 34 and simultaneously allow second layer 40 to be epitaxially grown with few defects, but first layer 36 also causes a larger portion of the total bandgap discontinuity between emitter 38 and base region 34 to appear as a valence band discontinuity, which is particularly useful in suppressing hole injection. This relatively large valence band discontinuity significantly suppresses hole injection from base region 34 to emitter 38, creating an HBT with greatly improved emitter injection efficiency compared to prior art HBTs.

In summary, an improved HBT having a wide bandgap with a low interdiffusion base-emitter junction is provided along with a method for forming the HBT. The HBT uses a Si substrate which is desirable because this takes advantage of the existing manufacturing infrastructure that reliably produces relatively rugged Si wafers at low cost. A multilayer emitter is provided in the HBT. This emitter exhibits a wide bandgap, and the resulting base-emitter junction is substantially free of interdiffusion. In a preferred embodiment, the HBT is provided with a Si base region that forms a junction with a multilayer emitter having a thin GaAs layer proximate the base region and a distal GaP layer. The base-emitter junction, which is substantially free of interdiffusion, and the wide bandgap multilayer emitter together allow an HBT configured in accordance with the present invention to exhibit performance more closely meeting theoretical expectations than does the performance of conventional HBTs.

The present invention has been described above with reference to preferred embodiments. However, those skilled in the art will recognize that changes and modifications may be made in these preferred embodiments without departing from the scope of the present invention. For example, while the above-presented description discusses the formation of a single HBT, those skilled in the art will readily recognize that a multiplicity of HBTs may be simultaneously formed as described above, or in an equivalent manner, for integrated circuit or discrete transistor applications. These and other changes and modifications which are obvious to those skilled in the art are intended to be included within the scope of the present invention.

What is claimed is:

1. A heterojunction bipolar transistor comprising:

a silicon (Si) collector region of a first conductivity type;

a Si base region of a second conductivity type formed adjacent to said collector region;

a gallium arsenide (GaAs) layer formed over and in contact with said Si base region, said GaAs layer forming a first portion of a multilayer emitter; and a gallium phosphide (GaP) layer of said first conductivity type formed over said GaAs layer, said GaP layer forming a second portion of said multilayer emitter.

2. A heterojunction bipolar transistor as claimed in claim 1 wherein said GaAs layer is less than 200 Å thick.

3. A heterojunction bipolar transistor as claimed in claim 1 wherein said GaAs layer is sufficiently thin so as to be coherently strained.

4. A heterojunction bipolar transistor as claimed in claim 1 wherein said GaAs layer is configured so as not to exhibit said second conductivity type.

5. A heterojunction bipolar transistor as claimed in claim 1 wherein a base-emitter transistor junction located at an interface between said Si base region and said GaAs layer is substantially free of interdiffusion.

6. A heterojunction bipolar transistor as claimed in claim 1 wherein said GaAs layer and said GaP layer are epitaxially grown.

7. A heterojunction bipolar transistor as claimed in claim 1 wherein said GaAs layer is epitaxially grown at a temperature of less than 800° C.

8. A heterojunction bipolar transistor as claimed in claim 7 wherein said GaP layer is epitaxially grown at a temperature of less than 800° C.

9. A heterojunction bipolar transistor as claimed in claim 1 wherein said GaP layer is at least 500 Å thick.

10. A heterojunction bipolar transistor comprising:

a silicon (Si) collector region of a first conductivity type;

a Si base region of a second conductivity type formed adjacent to said collector region;

a first non-silicon layer epitaxially grown over and in contact with said Si base region so as to form an emitter-base transistor junction that is substantially free of interdiffusion, said first non-silicon layer forming a first portion of a multilayer emitter; and a second non-silicon layer epitaxially grown over said first non-silicon layer, said second non-silicon layer exhibiting said first conductivity type and a bandgap wider than silicon, and said second non-silicon layer forming a second portion of said multilayer emitter.

11. A heterojunction bipolar transistor as claimed in claim 10 wherein said first non-silicon layer is gallium arsenide (GaAs).

12. A heterojunction bipolar transistor as claimed in claim 10 wherein said first non-silicon layer is coherently strained between said silicon base region and said second non-silicon layer.

13. A heterojunction bipolar transistor as claimed in claim 12 wherein said first non-silicon layer is gallium arsenide (GaAs) and has a thickness of less than 200 Å.

14. A heterojunction bipolar transistor as claimed in claim 10 wherein said second non-silicon layer is gallium phosphide (GaP).

* * * * *